(12) United States Patent
Narasimhan et al.

(10) Patent No.: US 8,270,171 B2
(45) Date of Patent: Sep. 18, 2012

(54) COOLING ARRANGEMENT FOR A RACK MOUNTED PROCESSING DEVICE

(75) Inventors: Susheela Nanjunda Rao Narasimhan, Fremont, CA (US); Hong Tran Huynh, Fremont, CA (US); Toan Nguyen, San Jose, CA (US); Duong Cu Lu, Hayward, CA (US); Phillip S. Ting, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 65 days.

(21) Appl. No.: 12/787,171

(22) Filed: May 25, 2010

(65) Prior Publication Data

US 2011/0292602 A1  Dec. 1, 2011

(51) Int. Cl.
*H05K 7/20* (2006.01)
(52) U.S. Cl. ............... 361/713; 361/679.51; 361/692; 361/710; 174/15.1; 181/198; 181/202
(58) Field of Classification Search ........... 361/679.46–679.51, 676, 688–695, 361/704–715
See application file for complete search history.

(56) References Cited

U.S. PATENT DOCUMENTS

| | | | |
|---|---|---|---|
| 6,958,906 B2 * | 10/2005 | Wu et al. ............... | 361/679.5 |
| 7,173,822 B2 * | 2/2007 | Liang et al. ............ | 361/695 |
| 7,408,773 B2 * | 8/2008 | Wobig et al. ........... | 361/695 |
| 2002/0154481 A1 | 10/2002 | Wagner .................. | 361/694 |
| 2004/0201957 A1 * | 10/2004 | Wu et al. ............... | 361/687 |
| 2009/0097200 A1 * | 4/2009 | Sharma et al. ........ | 361/688 |
| 2010/0290187 A1 * | 11/2010 | Guan ..................... | 361/695 |
| 2011/0043997 A1 * | 2/2011 | Guan ..................... | 361/692 |

OTHER PUBLICATIONS

"Cisco Nexus 5000 Series Switches," downloaded from http://www.cisco.com/en/US/prod/collateral/switches/ps9441/ps9670/data_sheet_c78-461802.html, on May 25, 2010, 22 pages.
"Arista 7100 Series 10G SFP Data Center Switches—Data Sheet," downloaded from http://www.aristanetworks.com/media/system/pdf/7100_Datasheet.pdf, on May 24, 2010, 4 pages.
"Cisco Catalyst 4948 Switch," downloaded from http://www.cisco.com/en/US/prod/collateral/switches/ps5718/ps6021/product_data_sheet0900aecd8017a72e.html, on May 24, 2010, 20 pages.
Extended European Search Report issued Oct. 7, 2011, in European Patent Application No. 10196983.0, 6 pages.

* cited by examiner

*Primary Examiner* — Courtney Smith
(74) *Attorney, Agent, or Firm* — Brinks Hofer Gilson & Lione (57) ABSTRACT

To increase air flow, an air intake/outtake (i.e., intake, outtake, or both) is positioned on a front surface of a housing, such as a rack-mounted computer network switch housing. The front surface includes jacks, controls, plugs, receptacles or other input/output for connection with the processor in the housing. The air intake/outtake is one or more openings on the front surface with the input/output components. In one embodiment, to avoid interference with the input/output components and increasing the height of the housing, the air intake/outtake is a slot extending most of or all of the distance between the sides of the housing and being above or below the input/output. An intermediate plate may be used to form and support the air intake/outtake.

24 Claims, 5 Drawing Sheets

COOLING ARRANGEMENT FOR A RACK MOUNTED PROCESSING DEVICE

FIELD

The present embodiments relate to a cooling arrangement for rack mounted processing devices.

BACKGROUND

Data centers include rows of stacked computer and communication equipment. For cooling purposes, computer and communication equipment draws air from the surrounding environment into the equipment at one side and exhausts the air out of the equipment at another side. A data center may include an arrangement of hot aisles and cold aisles in order to increase the cooling efficiency of the data center. By mounting a row of the stacked computer and communication equipment in the same direction, cold air from the cold aisle will flow into the equipment, and hot air will exhaust out of the equipment to the hot aisle.

Some computer and communication equipment such as, for example, aggregation switches (top-of-rack switches), includes a plurality of I/O connectors (e.g., RJ45 connectors or SFP connectors) at the front side. In order to reduce mixing of the hot air in the hot aisle and the cold air in the cold aisle, and thus improve the cooling efficiency of the data center, computer and communication equipment may draw air in from the cold aisle at a left, right or top side and exhaust air to the hot aisle at a back side.

DETAILED DESCRIPTION OF THE DRAWINGS

Overview

To increase air flow, an air intake/outtake (i.e., intake, outtake, or both) is positioned on a front surface of a housing, such as a rack-mounted computer network switch housing. The front surface includes jacks, controls, plugs, receptacles or other input/output for connection with the processor in the housing. The air intake/outtake is one or more openings on the front surface with the input/output components. In one embodiment to avoid interference with the input/output components and increasing the height of the housing, the air intake/outtake is a slot extending most of or all of the distance between the sides of the housing and being above or below the input/output. An intermediate plate may be used to form and support the air intake/outtake.

In one embodiment, an apparatus includes a housing of a rack-mount electrical hardware component, the housing having a front, back, sides, top and bottom. The apparatus also includes an input/output connector on the front of the housing, a first air intake/outtake formed on the front of the housing, and a second air intake/outtake formed on the back, top, bottom, sides, or combinations thereof. The input/output connector is electrically connected with the electrical hardware component. The apparatus includes an intermediate plate that is attached to the housing such that an air flow channel extends between the first and second air intake/outtakes, through a plurality of openings in the intermediate plate, and adjacent to the heat generating electrical hardware component.

In another embodiment, an apparatus includes a chassis including a fan and a heat generating component. The fan moves air through the apparatus to cool the heat generating component. The apparatus also includes a top plate that is attached to the chassis such that the apparatus includes openings at a front and a back of the apparatus. An intermediate plate is attached to a bottom surface of the top plate such that a channel extends from the front of the apparatus at least partly into the apparatus. The intermediate plate includes a plurality of perforations.

In yet another embodiment, a method includes moving air through a channel of an apparatus, the channel being formed by a top plate and an intermediate plate of the apparatus, guiding the air through a plurality of openings in the intermediate plate, guiding the air adjacent to a heat generating component disposed on a bottom plate of the apparatus, and moving the air through a back of the apparatus. The top plate is attached to the bottom plate such that the apparatus includes openings at a front and the back of the apparatus.

Example Embodiments

Figure 1:
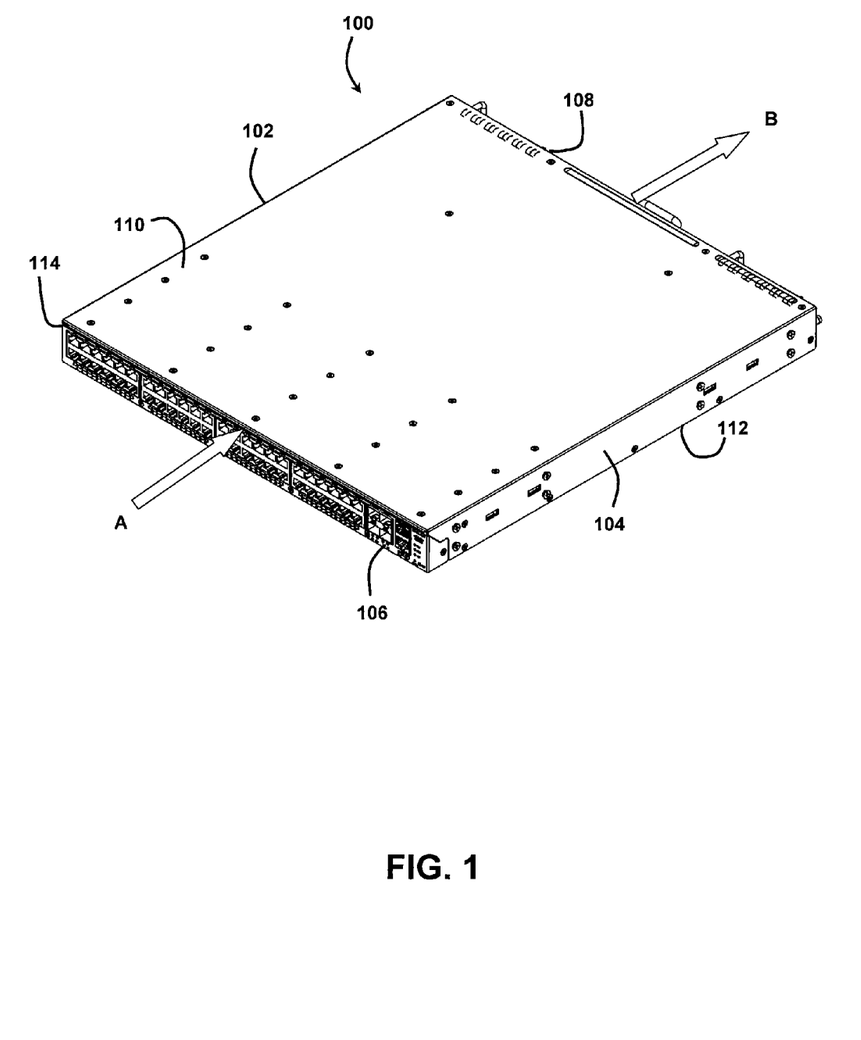
FIG. 1 illustrates a perspective view of one embodiment of a housing for stacking.

FIG. 1 illustrates a perspective view of one embodiment of a box-type housing 100 for stacking. The housing 100 includes a first side 102, a second side 104 (e.g., long and narrow rectangular sides 102, 104), a front end 106, and a back end 108 (e.g., long and narrow ends 106, 108). The housing also includes a top 110 and a bottom 112 (e.g., wide and long rectangular top 110 and bottom 112). The box-type housing 100 may be any number of shapes including, for example, a rectangular box.

The front end 106 and the top 110 form an opening 114 (e.g., an air intake/outtake 114) in the housing 100. The opening 114 is not formed at the first side 102, the second side 104, the top 110 or the bottom 112. The opening 114 runs the length of the front end 106. In one embodiment, the opening 114 runs a portion of the length of the front end 106. The opening 114 may also be separated into a plurality of individual openings 114.

In one embodiment, air is pulled into the housing 100 at the opening 114, as indicated by arrow A. Air is pulled through the housing 100 and pushed out of the housing 100 at the back end 108, as indicated by arrow B. In another embodiment, the flow of air is reversed, as air is pulled into the housing 100 at the back end 108, pushed through the housing 100, and pushed out of the housing 100 at the opening 114.

Figure 2:
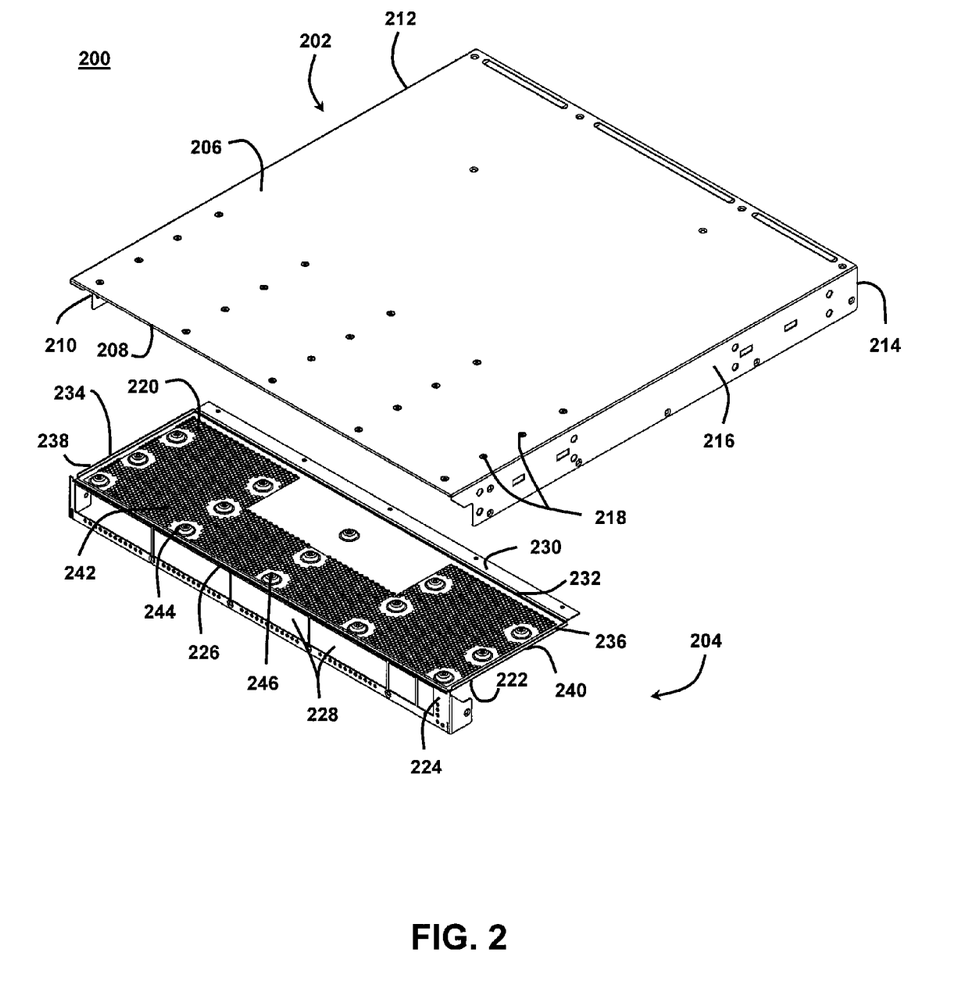
FIG. 2 illustrates an exploded view of one embodiment of a cooling device.

FIG. 2 illustrates an exploded view of one embodiment of part of a cooling device 200 that forms the front end 106 and the top 110 of the housing 100 illustrated in FIG. 1 or a different housing. The cooling device 200 includes a top plate 202 and an intermediate plate 204. The top plate 202 includes a top surface 206 and a bottom surface 208. A first flange 210 of the top plate 202 extends away from the bottom surface 208 in an approximately perpendicular direction at a first side 212, and a second flange 214 of the top plate 202 extends away from the bottom surface 208 in an approximately perpendicular direction at a second side 216. The top plate 202 includes a plurality of holes 218 that extend through the top plate 202. The top plate 202 may be made of any number of materials including, for example, steel. Other arrangements of flanges, tabs, and holes may be provided for the top plate 202. The top plate 202 may be formed from more than one piece.

The intermediate plate 204 includes a top surface 220 and a bottom surface 222. A first flange 224 of the intermediate plate 204 extends away from the bottom surface 222 in an approximately perpendicular direction at a front end 226 of the intermediate plate 204. The first flange 224 of the intermediate plate 204 includes a plurality of openings 228. A second flange 230 of the intermediate plate 204 extends away from the top surface 220 in an approximately perpendicular direction at a back end 232 of the intermediate plate 204. A third flange 234 and a fourth flange 236 of the intermediate plate 204 also extend away from the top surface 220 of the intermediate plate 204 in an approximately perpendicular direction at a first side 238 and a second side 240, respectively. The heights of the second flange 230, the third flange 234, and the fourth flange 236 may be, for example, between approximately 2.8 mm (0.11 in.) and 3.0 mm (0.12 in.). The width of the intermediate plate 204 may be, for example, approximately 14 cm (5.5 in.). The intermediate plate 204 may be made of any number of materials including, for example, steel. The intermediate plate 204 may be made of 18 gauge sheet metal, for example. Other arrangements of flanges, tabs, and holes may be provided for the intermediate plate 204. The intermediate plate 204 may be formed from more than one piece.

In one embodiment, the second flange 230 of the intermediate plate 204 is a second bracket 230 that runs the length of the intermediate plate 204. The third flange 234 and the fourth flange 236 of the intermediate plate 204 are third and fourth brackets 234, 236 that run the width of the intermediate plate 202. The second bracket 230, the third bracket 234, and the fourth bracket 236 may provide electromagnetic interference (EMI) shielding.

The intermediate plate 204 includes a plurality of openings 242 (e.g., a plurality of equally sized perforations 242) that extend through the intermediate plate 204 in a direction approximately perpendicular to the top surface 220. The diameter of each of the plurality of perforations 242 may be, for example, approximately 3.0 mm (0.12 in.). The plurality of perforations 242 may be arranged in any number of patterns including, for example, a u-shaped pattern (as illustrated in FIG. 2). The bottom surface 222 of the intermediate plate 204 may also provide EMI shielding (e.g., in addition to the second bracket 230, the third bracket 234, and the fourth bracket 236). The number of openings 242 and the size of the openings 242 may affect the degree to which the intermediate plate 204 provides EMI shielding. In alternative embodiments, one or a few number of openings 242 are provided in the intermediate plate 204. In yet other embodiments, the intermediate plate 204 is not included.

The intermediate plate 204 also includes a plurality of indentations 244 (e.g., a plurality of dimples 244) that extend away from the top surface 220 of the intermediate plate 204 in an approximately perpendicular direction. Each of the plurality of dimples 244 includes a hole 246 that extends through the intermediate plate 204 at the center of the dimple 244. Some or all of the holes 246 may be tapped. Neighboring dimples 244 may be equally spaced in both a direction approximately parallel to the front end 226 and a direction approximately perpendicular to the front end 226. In the embodiment illustrated in FIG. 2, the intermediate plate includes 15 dimples 244 arranged in three rows equally spaced in the direction approximately perpendicular to the front end 226, each row including five dimples 244 equally spaced in a direction approximately parallel to the front end 226. In one embodiment, each of the plurality of dimples 244 extends approximately 3.8 mm (0.15 in.) away from the top surface 220. Other arrangements, numbers, sizes, or positions of indentations 244 may be provided.

Figure 3:
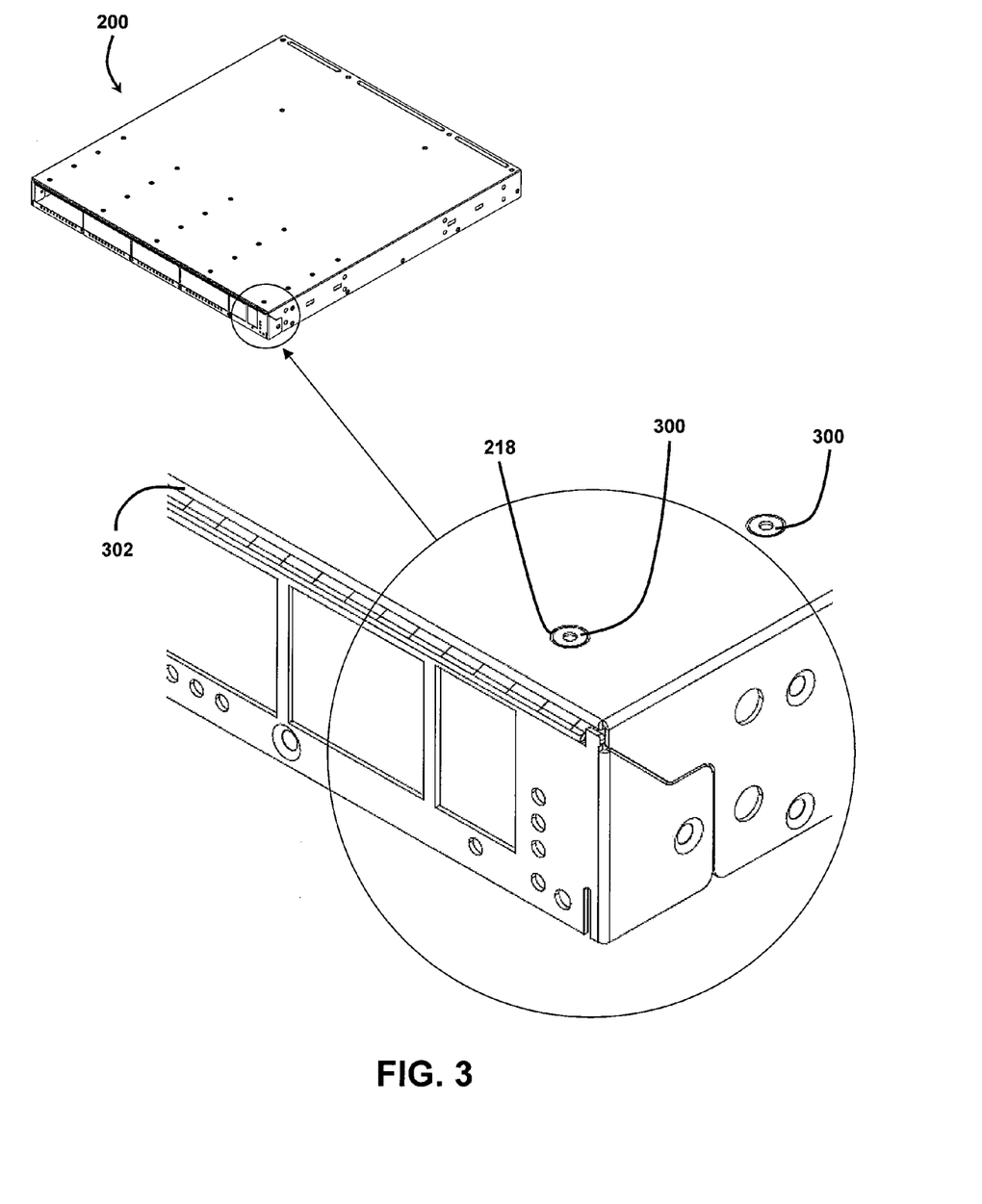
FIG. 3 illustrates a perspective view of the assembled cooling device of FIG. 2.

FIG. 3 illustrates a perspective view of the part of the cooling device 200 of FIG. 2 assembled. To assemble the cooling device 200, the plurality of dimples 244 of the intermediate plate 204 are attached to the bottom surface 208 of the top plate 202 (not shown in FIG. 3). In one embodiment, a plurality of fasteners 300 are disposed in the plurality of holes 218 of the top plate 202 and the holes 246 in the plurality of dimples 244 to fasten the plurality of dimples 244, and ultimately the intermediate plate 204, to the top plate 202. A portion of the plurality of fasteners 300 may be disposed in a corresponding portion of the plurality of holes 218 of the top plate 202 to fasten the second flange 230 of the intermediate plate 204 to the top plate 202. The plurality of fasteners 300 may include, for example, screws or nut/bolt combinations. Clips, latches, grooves or other mating or connection devices may also be used.

When the cooling device 200 is assembled, the bottom surface 208 of the top plate 202, the top surface 220 of the intermediate plate 204, and the second, third and fourth flanges 230, 234, 236 (as shown in FIG. 2) of the intermediate plate 204 form a channel 302 (e.g., the opening 114). The depth of the channel 302 is determined by the width of the intermediate plate 204, and the height of the channel 302 is determined by the height of the second flange 230 of the intermediate plate 204. The height of the channel 202 may be, for example, between approximately 2.8 mm (0.11 in.) and 3.0 mm (0.12 in.).

The plurality of dimples 244 provide structural support for the top plate 202 in order to maintain an approximately constant distance between the bottom surface 208 of the top plate 202 and the top surface 220 of the intermediate plate 204. The plurality of dimples 244 may provide structural support when the cooling device 200 is included in computer or communications equipment that is stacked underneath other heavy computer or communications equipment.

The cooling device 200 may be used in any number of systems including, for example, switches (e.g., aggregate switches), computers, servers, and stereo equipment (e.g., receivers and amplifiers). The cooling device 200 may be used in any system that includes heat-generating components that are convectively cooled. The cooling device 200 may also be used in any system that is included in a vertically stacked arrangement (e.g., racks in a data center).

Figure 4:
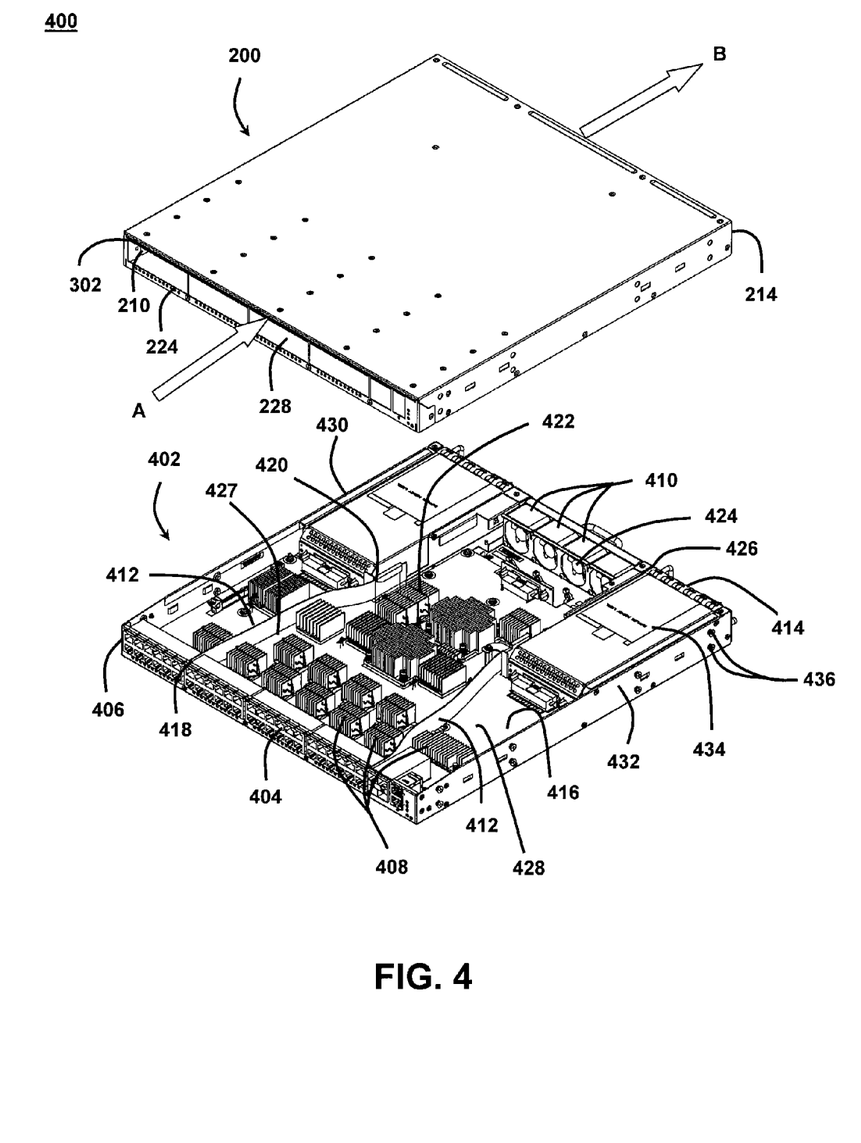
FIG. 4 illustrates an exploded view of one embodiment of a switch including the cooling device of FIGS. 2 and 3.

FIG. 4 illustrates an exploded view of one embodiment of a switch 400 including the cooling device 200 of FIGS. 2 and 3 (or a different cooling device) and a bottom plate 402 (e.g., a chassis 402). The chassis 402 includes a plurality of components 404 such as, for example, a plurality of input/output (I/O) connectors (e.g., RJ45 connectors or SFP connectors) at a front end 406. I/O is used for only input, only output, or both input and output connections.

The chassis 402 also supports a plurality of heat generating electrical hardware components 408, a plurality of fans 410 (e.g., four fans), a plurality of baffles 412 (e.g., two baffles), and dedicated fans 414. The plurality of heat generating electrical hardware components 408, the plurality of fans 410, the plurality of baffles 412, and the dedicated fans 414 may be attached to a top surface 416 of the chassis 402 using, for example, an adhesive, screws, nut/bolt combinations, other devices, or a combination thereof. In the embodiment shown in FIG. 4, each of the plurality of baffles 412 are supported on the chassis 402 at corresponding first slots 418 and corresponding second slots 420 of the chassis 402. The switch 400 may include different, additional, or fewer components.

The plurality of heat generating electrical hardware components 408 may include heat sinks 422 to aid in the transfer of heat from the plurality of heat generating electrical hardware components 408 to the surrounding air. The plurality of heat generating electrical hardware components 408 may include, for example, processors, circuits, transistors, memory devices, power supplies, or other electronics.

In one embodiment, air is pulled through the channel 302 in the direction of the arrow A. Inside of the switch 400, the air flows through the plurality of perforations 242 in the intermediate plate 204 (as shown in FIG. 2). The air traverses through the switch 400 and is exhausted out of the switch 400 in the direction of the arrow B at a plurality of openings 424 at a back end 426 of the switch 400. The plurality of openings 424 at the back end 426 of the switch 400 may be openings between blades of a fan 410, vent holes, other openings, or a combination thereof. Other openings may additionally be provided, such as in the sides, top, or bottom of the switch 400.

In one embodiment, the direction of airflow through the channel 302 is reversed. Air is pulled through the plurality of openings 424 at the back end 426 of the switch 400. The air traverses through the switch 400, through the plurality of perforations 242 in the intermediate plate 204, and is pushed out of the channel 302.

The plurality of fans 410 pull or push (e.g., depending on the direction the plurality of fans 410 are attached to the chassis 402) air into or out of the channel 302 through a main compartment 427 of the switch 400. The main compartment 427 of the switch 400 is defined by the two baffles 412. The two baffles 412 direct air pulled in or pushed out of the channel 302 by the plurality of fans 410 around the plurality of heat generating electrical hardware components 408 located in the main compartment 427. In one embodiment, the plurality of fans 410 pull air through the channel 302, through the plurality of perforations 242 in the intermediate plate 204, into the main compartment 427 of the chassis 402, and around the heat sinks 422 of the heat generating electrical hardware components 408. The plurality of fans 410 exhaust the air out of a back end 426 of the chassis 402.

The dedicated fans 414 pull or push (e.g., depending on the direction the dedicated fans 414 are attached to the chassis 402) air into or out of the channel 302 through secondary compartments 428 (e.g., two secondary compartments 428) of the chassis 302. The secondary compartments 428 are each defined by one of the two baffles 412 and a first side 430 or a second side 432 of the chassis 402. In each of the secondary compartments 428, one of the two baffles 412 directs air pulled in or pushed out of the channel 302 by one of the dedicated fans 414 around and/or through at least one of the plurality of heat generating electrical hardware components 408 (e.g., a power supply 434) located in the secondary compartment 428. In one embodiment, the dedicated fans 414 pull air through the channel 302, through the plurality of perforations 242 in the intermediate plate 204, into the secondary compartments 428 of the chassis 402, and around and/or through the power supplies 434 located in the secondary compartments 428. The dedicated fans 414 exhaust the air out of the back end 426 of the chassis 402. The chassis 402 may support fewer or more baffles 412. Other arrangements internal to the switch 400 may be provided.

As illustrated in FIG. 2, the plurality of dimples 244 in the intermediate plate 204 help separate and direct the air pulled into or pushed out of the channel 302 by the plurality of fans 410 and the dedicated fans 414, into the main compartment 427 and each of the secondary compartments 428 of the chassis 402. As illustrated in FIG. 2, the plurality of perforations 242 may be arranged in a u-shaped pattern. The u-shaped arrangement of the plurality of perforations 242 diverts more air to the secondary compartments 428, and thus the power supplies 434, than an arrangement where the plurality of perforations 242 are equally distributed across the top surface 220 of the intermediate plate 204. Other arrangements of the plurality of perforations 242 may be provided.

In one embodiment, the cooling device 200 is attached to the chassis 402 with a second plurality of fasteners 436 at the first flange 210 and the second flange 214 of the top plate 202. The second plurality of fasteners 436 may include, for example, screws or nut/bolt combinations, but other connections may be used. When assembled, the plurality of components 404 is disposed in the plurality of openings 228 in the first flange 224 of the intermediate plate 204. The cooling device 200 is attached to the chassis 402 such that the switch 400 includes an opening (e.g., the channel 302) at the front end 406 of the switch 400 and the plurality of openings 424 at the back end 426 of the switch 400. The channel 302 and the plurality of openings 424 of the switch 400 may be the only openings in the switch 400, through which air may flow.

In one embodiment, a plurality of switches 400 is stacked vertically in a rack such that the front ends 406 of the plurality of switches 400 face in the same direction. Air is pulled into or pushed out of each channel 302 of the plurality of switches 400. Inside the plurality of switches 400, the air flows through the plurality of perforations 242 in each of the intermediate plates 204 (as shown in FIG. 2). The air traverses through each switch 400 and is pushed out of or pulled into each of the plurality of switches 400 at the plurality of openings 424 at the back end 426 of each switch 400. Other openings may additionally be provided, such as in the sides, top, or bottom of the switch 400. The air may be pulled into or pushed out of the plurality of switches 400 by the plurality of fans 410 in each switch 400. In one embodiment, the plurality of fans 410 in the plurality of vertically stacked switches 400 are oriented in the same direction such that air flows through each of the plurality of switches 400 in the same direction.

In one embodiment, the cooling device 200 may be configured for impingement cooling. The plurality of fans 410 and/or the dedicated fans 414 may pull air through the channel 302 and a small orifice in the intermediate plate 204 to form a jet of air. The jet of air may be directed toward and around a heat generating electrical hardware component 408 supported on the chassis 402 to provide spot cooling of hot spots within the switch 400.

In one embodiment, the plurality of dimples 244 of the intermediate plate 204 may be attached to the top surface 416 of the chassis 402 (e.g., instead of the plurality of dimples 244 being attached to the bottom surface 208 of the top plate 202), such that the channel 302 is formed at a bottom side of the front end 406 of the switch 400.

Figure 5:
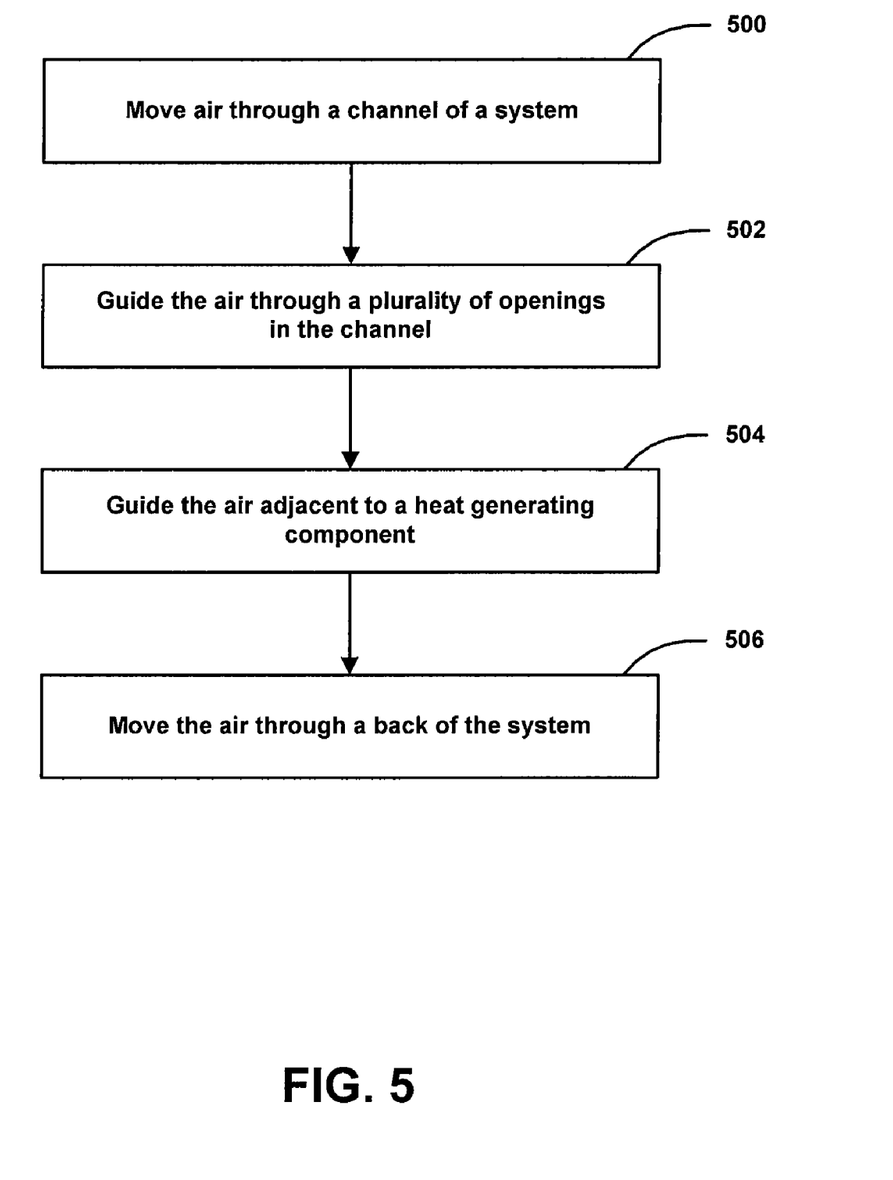
FIG. 5 illustrates a flow chart of cooling a heat-generating component using the cooling device of FIGS. 2 and 3.

FIG. 5 illustrates a flow chart of cooling a heat generating component using the cooling device 200 of FIG. 2 or a different cooling device. The method is implemented in the order shown, but other orders may be used. Additional, different, or fewer acts may be provided.

At block 500, air is moved through a channel of a system. The channel is formed in a front with I/O connectors. A bottom surface of a top plate and a top surface of an intermediate plate of the system form the channel, but other components may be used to form the air intake in the front (e.g., a single device molded or shaped to include the air intake). The air is moved into the device from the front and exits out the back, but may exit out the sides. The channel may be a single channel or may branch into a plurality of channels. More than one intake may be provided for a common channel or separate channels. The air is moved by convection and/or by force (e.g., by fans). The air channel may include only openings at the front and back of the device, but may include openings on the top, bottom, or sides instead of or as well.

At block 502, the air is guided through a plurality of openings within the channel. Only one or no further openings may be used. The openings are perforations. The air is directed by the perforations to specific locations. The perforations allow air flow while providing for structure to form and maintain the channel despite pressure from other devices in a rack.

At block 504, the air is guided adjacent to a heat generating component. Channels, baffles, arrangements of parts, or merely location within or adjacent the channel direct the air past the desired components. The air flow may be manipulated to increase or decrease in rate by certain components, such as by restricting or increasing a size of the channel.

At block 506, the air is moved through the back. The air exits through one or more holes, such as perforations. The channel ends at the back, but may alternatively or additionally end at the sides, top, or bottom.

In one embodiment, the air is moved through the channel of the system by pushing air out of the channel using a plurality of fans. The plurality of fans are supported on the bottom plate of the system, but may be supported elsewhere. In another embodiment, the air is moved through the channel of the system by pulling air into the channel using the plurality of fans. In yet other embodiments, the air is moved through the system by pressure differential or air force outside of the system.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
   a housing of a rack-mount electrical hardware component, the housing having a front, back, sides, top, and bottom;
   an input/output connector on the front of the housing, the input/output connector electrically connected with the electrical hardware component;
   a first air intake/outtake formed on the front of the housing;
   a second air intake/outtake formed on the back, top, bottom, sides, or combinations thereof; and
   an intermediate plate comprising a top surface, a bottom surface, and a plurality of openings each extending through the top surface and the bottom surface of the intermediate plate, the intermediate plate attached to the housing such that an air flow channel extends between the first and second air intake/outtakes, through the plurality of openings in the intermediate plate, and adjacent to a heat generating component of the electrical hardware component, the plurality of openings arranged on the intermediate plate to maintain electromagnetic interference shielding provided by the intermediate plate and to concurrently enable air to flow through the intermediate plate;
   wherein a portion of the air flow channel is defined by a bottom surface of the top of the housing and the top surface of the intermediate plate.

2. The apparatus of claim 1, wherein the plurality of openings is a plurality of equally-sized perforations.

3. The apparatus of claim 1, wherein the intermediate plate further comprises a plurality of indentations extending toward the bottom surface of the top of the housing, and the intermediate plate is attached to the bottom surface of the top of the housing at the plurality of indentations to maintain an approximately constant distance between the bottom surface of the top of the housing and the top surface of the intermediate plate along a depth of the portion of the air flow channel.

4. The apparatus of claim 1, wherein the intermediate plate further comprises a flange extending toward and approximately perpendicular to the bottom surface of the top of the housing, and the flange defines a height of the portion of the air flow channel.

5. The apparatus of claim 1, wherein the bottom of the housing comprises a fan, and the fan is configurable to push air out of the channel or pull air into the channel at the front of the housing.

6. The apparatus of claim 1, wherein the bottom of the housing comprises a fan, and the fan pulls air into the channel, the air flowing through the housing from the front to the back of the housing.

7. The apparatus of claim 1, wherein the bottom of the housing comprises a fan, and the fan pushes air out of the channel, the air flowing through the housing from the back to the front of the housing.

8. The apparatus of claim 1, wherein the bottom of the housing comprises a fan and a baffle to guide airflow in the housing, the portion of the air flow channel defined by the bottom surface of the top of the housing and the top surface of the intermediate plate is a first portion, and a second portion of the air flow channel is defined by the baffle.

9. An apparatus comprising:
   a chassis comprising:
   a fan; and
   a heat generating component;
   a top plate attached to the chassis such that the apparatus includes openings at a front and back of the apparatus; and
   an intermediate plate attached to a bottom surface of the top plate such that a channel extends from the front of the apparatus at least partly into the apparatus, the channel defined between the top plate and the intermediate plate,
   wherein the intermediate plate comprises a plurality of perforations, and the plurality of perforations are arranged on the intermediate plate to maintain electromagnetic interference shielding provided by the intermediate plate and to concurrently enable air to flow through the intermediate plate, and
   wherein the fan moves air through the channel and the plurality of perforations to cool the heat generating component.

10. The apparatus of claim 9, wherein the intermediate plate further comprises a plurality of indentations extending toward the bottom surface of the top plate, and
   wherein the intermediate plate is attached to the bottom surface of the top plate at the plurality of indentations.

11. The apparatus of claim 9, wherein the chassis is a chassis for a top-of-rack switch.

12. The apparatus of claim 9, wherein the intermediate plate further comprises a flange extending toward and approximately perpendicular to the bottom surface of the top plate.

13. The apparatus of claim 9, wherein the fan pulls air into the channel, the air flowing through the apparatus from the front to the back of the apparatus.

14. The apparatus of claim 9, wherein the fan pushes air out of the channel, the air flowing through the apparatus from the back to the front of the apparatus.

15. The apparatus of claim 9, wherein the chassis further comprises a baffle to guide airflow in the apparatus.

16. A method comprising:
   moving air through a channel of an apparatus, the channel being formed by a top plate and an intermediate plate of the apparatus, the intermediate plate attached to the top plate;
   guiding the air through a plurality of openings in the intermediate plate;
   guiding the air adjacent to a heat generating component disposed on a bottom plate of the apparatus;
   moving the air through a back of the apparatus; and
   providing electromagnetic interference shielding with the intermediate plate, the plurality of openings arranged on the intermediate plate to maintain electromagnetic interference shielding provided by the intermediate plate and to concurrently enable air to flow through the intermediate plate;
   wherein the top plate is attached to the bottom plate such that the apparatus includes openings at a front and the back of the apparatus.

17. The method of claim 16, wherein moving air through the channel comprises pulling air into the channel with a fan.

18. The method of claim 16, wherein moving air through the channel comprises pushing air out of the channel with a fan.

19. The method of claim 16, wherein moving air through the channel comprises pulling air into the channel or pushing air out of the channel at the front of the apparatus with a fan that is configurable to pull or push air into or out of the channel.

20. The method of claim 16, wherein the plurality of openings is a plurality of equally-sized perforations.

21. The apparatus of claim 1, wherein the electromagnetic interference shielding is provided by the bottom surface of the intermediate plate.

22. The apparatus of claim 21, wherein a degree of electromagnetic interference shielding provided by the bottom surface of the intermediate plate is determined by a number of openings of the plurality of openings.

23. The apparatus of claim 1, wherein a degree of electromagnetic interference shielding provided by the intermediate plate is determined by a size of each of the plurality of openings.

24. The apparatus of claim 23, wherein the electromagnetic interference shielding is provided by the bottom surface of the intermediate plate.

* * * * *